(12) United States Patent
Song et al.

(10) Patent No.: US 10,644,258 B2
(45) Date of Patent: May 5, 2020

(54) OLED PANEL AND IMAGE DISPLAY DEVICE INCLUDING THE SAME

(71) Applicant: DONGWOO FINE-CHEM CO., LTD., Jeollabuk-do (KR)

(72) Inventors: In Kyu Song, Gyeonggi-do (KR); Jun Hee Sung, Incheon (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 161 days.

(21) Appl. No.: 15/936,955

(22) Filed: Mar. 27, 2018

(65) Prior Publication Data
US 2018/0287092 A1    Oct. 4, 2018

(30) Foreign Application Priority Data
Mar. 30, 2017    (KR) ........................ 10-2017-0040917

(51) Int. Cl.
| | |
|---|---|
| H01L 51/52 | (2006.01) |
| H01L 27/32 | (2006.01) |
| H01L 23/552 | (2006.01) |
| G06F 3/041 | (2006.01) |
| H01L 51/00 | (2006.01) |
| G06F 3/046 | (2006.01) |
| G06F 3/044 | (2006.01) |

(52) U.S. Cl.
CPC .......... *H01L 51/5253* (2013.01); *G06F 3/041* (2013.01); *G06F 3/0412* (2013.01); *H01L 23/552* (2013.01); *H01L 27/323* (2013.01); *H01L 51/0097* (2013.01); *H01L 51/5246* (2013.01); *H01L 51/5281* (2013.01); *G06F 3/044* (2013.01); *G06F 3/046* (2013.01); *G06F 2203/04102* (2013.01); *G06F 2203/04106* (2013.01); *G06F 2203/04107* (2013.01); *H01L 2251/5338* (2013.01); *H01L 2251/558* (2013.01)

(58) Field of Classification Search
CPC .......... G06F 3/041; G06F 3/044; G06F 3/046; G06F 3/0412; G06F 2203/04102; G06F 2203/04106; G06F 2203/04107; H01L 23/552; H01L 27/323; H01L 51/0097; H01L 51/5246; H01L 51/5281; H01L 2251/5338; H01L 2251/558
See application file for complete search history.

(56) References Cited

U.S. PATENT DOCUMENTS

| | | | |
|---|---|---|---|
| 7,601,982 B2 * | 10/2009 | Kim ..................... | H01L 27/3272 257/13 |
| 2013/0194205 A1 * | 8/2013 | Park ....................... | G06F 3/044 345/173 |
| 2014/0183478 A1 * | 7/2014 | Lee .......................... | H01L 51/56 257/40 |
| 2019/0220151 A1 * | 7/2019 | Mitsui .................. | G06F 3/0446 |

FOREIGN PATENT DOCUMENTS

KR    10-2014-0085306 A    7/2014

* cited by examiner

Primary Examiner — Wing H Chow
(74) Attorney, Agent, or Firm — The PL Law Group, PLLC

(57) ABSTRACT

An organic light emitting diode (OLED) panel includes an OLED module layer, and a first adhesive layer formed on a surface of the OLED module layer. A neutral plane is formed at an interface between the first adhesive layer and the OLED module layer. A bending deformation and a stress of the OLED module layer may be avoided, and damages of the OLED module layer may be reduced.

16 Claims, 4 Drawing Sheets

OLED PANEL AND IMAGE DISPLAY DEVICE INCLUDING THE SAME

CROSS-REFERENCE TO RELATED APPLICATION AND CLAIM OF PRIORITY

Figure 1A:
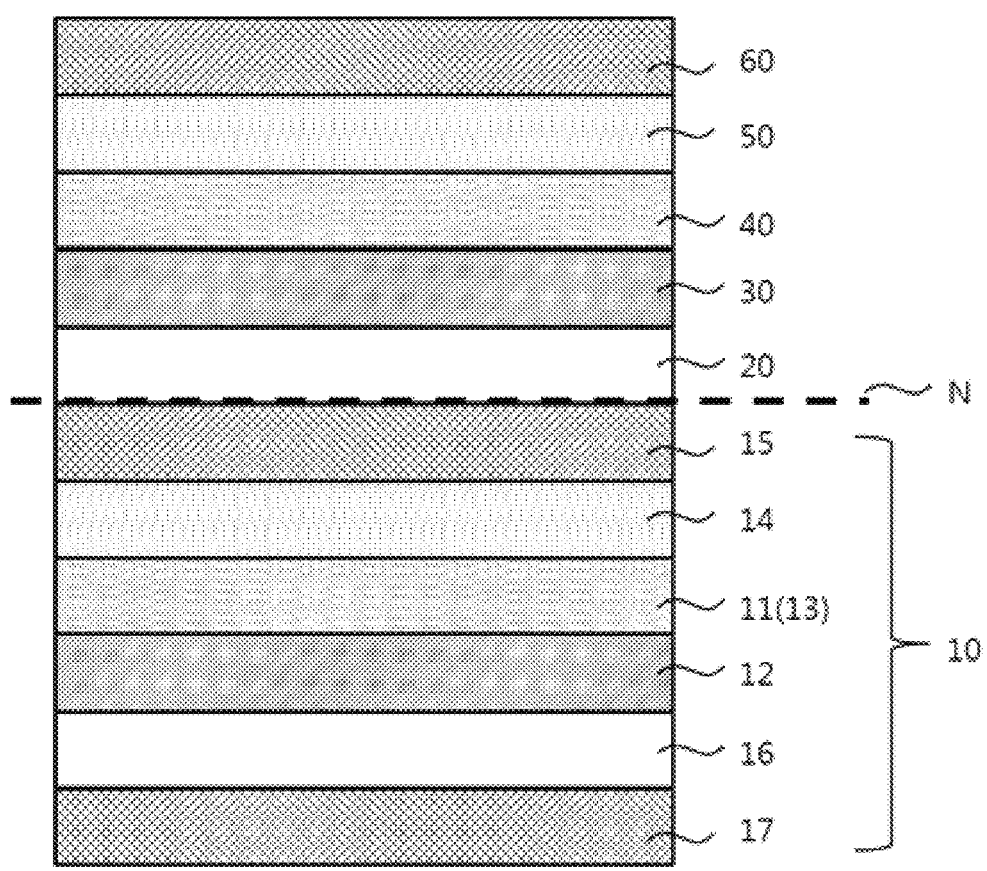

This application claims priority to Korean Patent Application No. 10-2017-0040917 filed on Mar. 30, 2017 in the Korean Intellectual Property Office (KIPO), the entire disclosure of which is incorporated by reference herein.

BACKGROUND

1. Field

The present invention relates to an OLED panel and an image display device including the same.

2. Description of the Related Art

As information technologies are being developed, various demands in display devices having thinner dimension, lightweight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

Among the display devices, the OLED display device is highlighted recently because of high response speed, high image quality, wide viewing angle, low power consumption, etc., thereof.

A touch panel capable of inputting a user's direction by selecting an instruction displayed on the image display device screen with the user's hand or an individual tool is also developed. The touch panel may be equipped on a front face of the image display device so that a touched positional information may be converted into an electrical signal.

Accordingly, the instruction selected at the touched position may be accepted as an input signal. A conventional input device such as a keyboard and a mouse individually connected to the image display device may be replaced with the touch panel, and an application range of the touch panel has been expanded.

Recently, a flexible flat panel display device is developed, and an OLED panel and a touch screen panel having flexible properties are also required to be applied to the flexible flat panel display device.

However, an OLED panel and a touch sensor conventionally used in an OLED display device may be easily broken or fractured when a bending force is applied. For example, Korean Patent Publication No. 2014-0085306 discloses an example of the OLED display device.

SUMMARY

According to an aspect of the present invention, there is provided an OLED panel having improved resistance to a bending deformation and a bending stress.

According to an aspect of the present invention, there is provided an image display device having improved bending property.

The above aspects of the present inventive concepts will be achieved by one or more of the following features or constructions:

(1) An organic light emitting diode (OLED) panel includes an OLED module layer, and a first adhesive layer formed on a surface of the OLED module layer, wherein a neutral plane is formed at an interface between the first adhesive layer and the OLED module layer.

(2) The OLED panel according to the above (1), wherein a thickness of the OLED module layer is in a range from 80 μm to 400 μm, and an elastic modulus of the OLED module layer is in a range from 1,000 MPa to 8,000 MPa.

(3) The OLED panel according to the above (1), wherein the OLED module layer includes an OLED device including an anode, an organic layer including an organic light emitting layer, a cathode and an encapsulation layer which are sequentially stacked.

(4) The OLED panel according to the above (1), wherein the OLED module layer further includes a digitizer layer and a shielding layer.

(5) The OLED panel according to the above (1), wherein a thickness of the first adhesive layer is in a range from 20 μm to 200 μm, and an elastic modulus of the first adhesive layer is in a range from 0.01 MPa to 1 MPa.

(6) The OLED panel according to the above (1), wherein the OLED module layer includes a touch sensor layer.

(7) The OLED panel according to the above (6), wherein a thickness of the touch sensor layer is in a range from 10 μm to 80 μm, and an elastic modulus of the touch sensor layer is in a range from 500 MPa to 6,000 MPa.

(8) The OLED panel according to the above (6), wherein a thickness of the OLED module layer is in a range from 80 μm to 260 μm, and an elastic modulus of the OLED module layer is in a range from 1,000 MPa to 8,000 MPa.

(9) The OLED panel according to the above (6), wherein the OLED module layer further includes an encapsulation layer, and the touch sensor layer is formed on a surface of the encapsulation layer.

(10) The OLED panel according to the above (1) further includes a stack structure formed on the other surface of the first adhesive layer which is not in contact with the OLED module layer, wherein the stack structure includes an optical layer, a second adhesive layer and a window substrate.

(11) The OLED panel according to the above (10), wherein a thickness of the stack structure is in a range from 60 μm to 500 μm, and an elastic modulus of the stack structure is in a range from 200 MPa to 6,000 MPa.

(12) The OLED panel according to the above (10), wherein the optical layer includes a stretching type polarizer or a coating type polarizer.

(13) The OLED panel according to the above (10), wherein the stack structure further includes a touch sensor layer.

(14) The OLED panel according to the above (13), wherein a thickness of the OLED module layer is in a range from 110 μm to 400 μm, and an elastic modulus of the OLED module layer is in a range from 1,000 MPa to 8,000 MPa.

(15) The OLED panel according to the above (13), wherein a thickness of the OLED module layer is in a range from 150 μm to 350 μm, and an elastic modulus of the OLED module layer is in a range from 1,000 MPa to 8,000 MPa.

(16) The OLED panel according to the above (13), wherein the touch sensor layer is formed on the other surface of the first adhesive layer which is not in contact with the OLED module layer.

(17) The OLED panel according to the above (13), wherein the touch sensor layer is directly formed on the optical layer.

(18) An image display device includes the OLED panel according to any one of the above (1) to (17).

According to exemplary embodiments of the present invention, the OLED panel and the image display device may include a neutral plane at an interface between the first adhesive layer and the OLED module layer so that a bending deformation and a stress to the OLED module layer may be minimized. Thus, damages of the OLED module layer and an OLED device including the OLED module layer may be minimized.

Further, the OLED panel and the image display device may have an improved bending property by the neutral plane at the interface between the first adhesive layer and the OLED module layer.

Further, a bending deformation and a stress to the OLED module layer and a touch sensor layer may be minimized. Thus, damages of the OLED module layer and the touch sensor layer may be prevented.

Figure 1B:
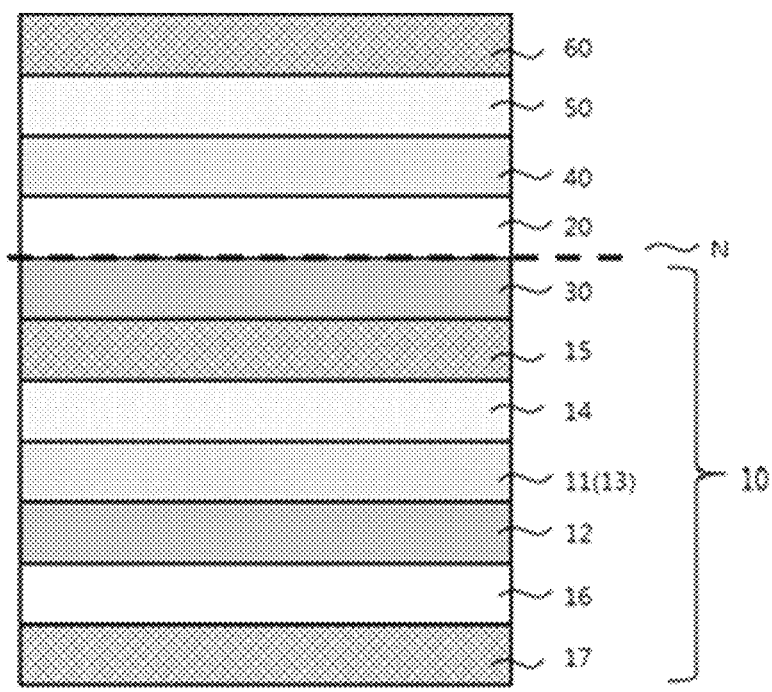
Figure 2:
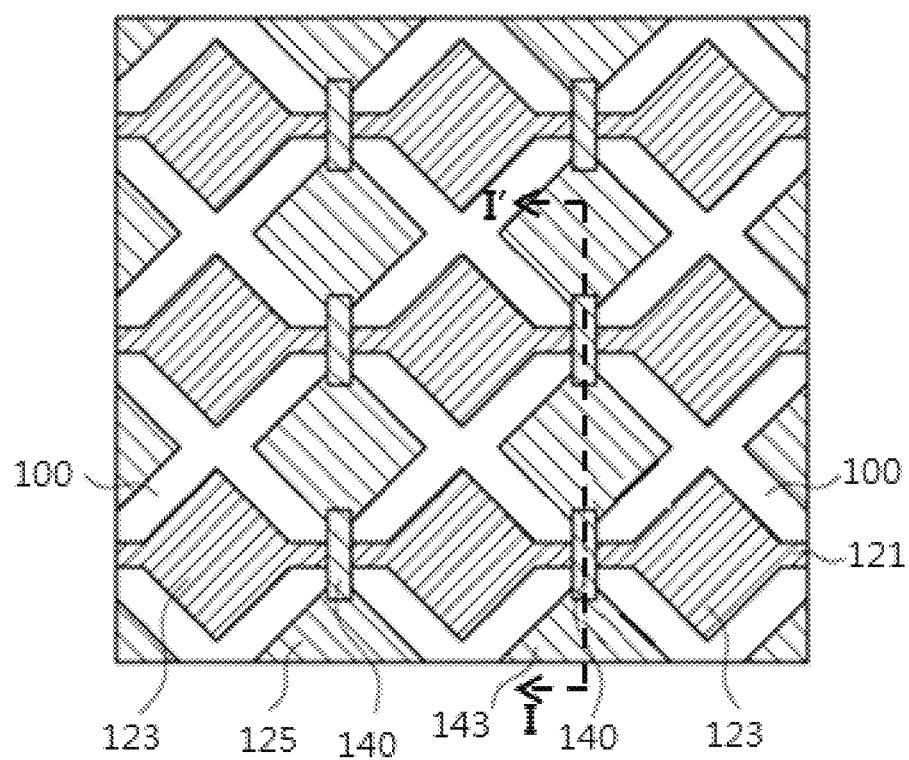
Figure 3:
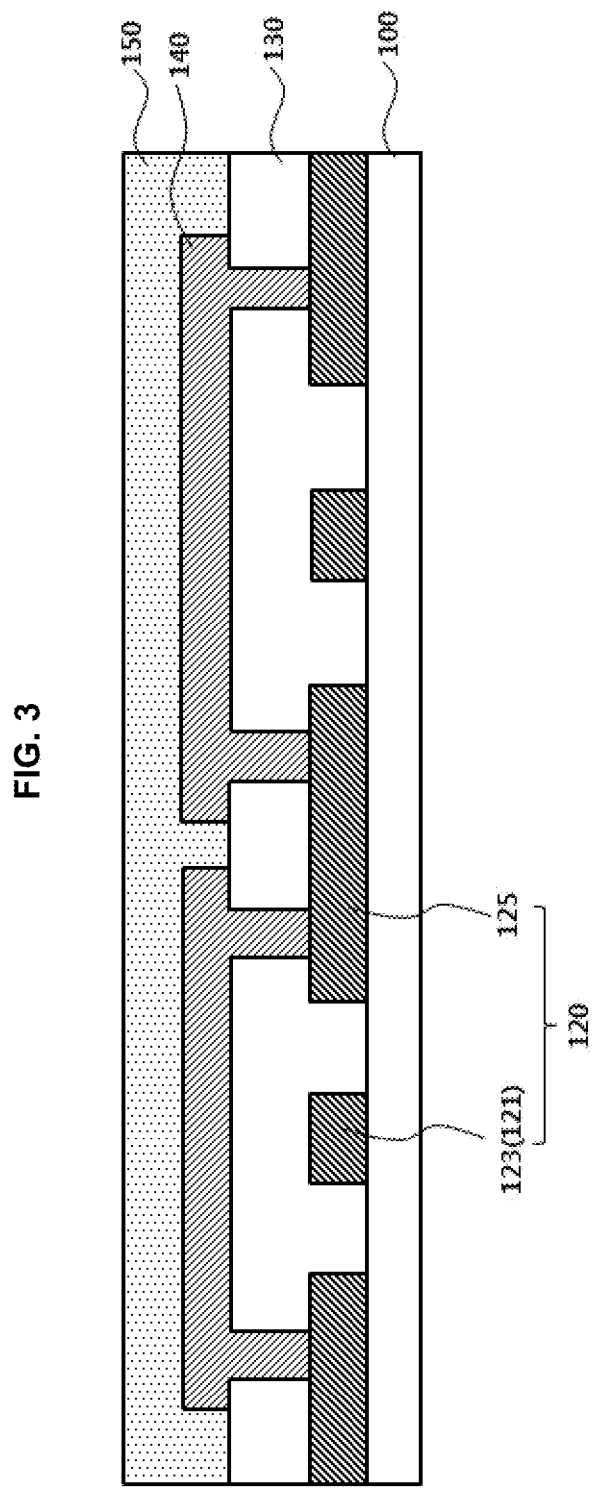

BRIEF DESCRIPTION OF THE DRAWINGS in order that the invention may be more clearly understood, reference will now be made to the accompanying drawings, wherein an embodiment of the invention is shown for purposes of illustration, and wherein FIGS. 1A and 1B are schematic cross-sectional views illustrating an OLED panel in accordance with exemplary embodiments; and FIGS. 2 and 3 are a top plane view and a cross-sectional view, respectively, illustrating a touch sensor layer in accordance with exemplary embodiments.

DETAILED DESCRIPTION

According to exemplary embodiments of the present invention, there is provided an OLED panel including a first adhesive layer and an OLED module layer formed on a surface of the first adhesive layer. In the OLED panel, a neutral plane may be formed at an interface between the first adhesive layer and the OLED module layer so that a bending deformation and a stress of the OLED module layer may be avoided, and damages of the OLED module layer may be reduced.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

In the accompanying drawings, dimensions or size of elements and members may be exaggerated or modified for convenience of descriptions without an intention of limiting the scope of the present invention.

The terms "first" and "second" used herein are intended to describe or distinguish different members or elements and are not intended to specify the number or the order of elements and define any relationship between elements.

Organic Light Emitting Diode (OLED) Panel

FIGS. 1A and 1B are schematic cross-sectional views illustrating an OLED panel in accordance with exemplary embodiments.

The OLED panel according to exemplary embodiments of the present invention may include an OLED module layer 10 and a first adhesive layer 20 formed on a surface of the OLED module layer 10, and a neutral plane (N) may be formed at an interface between the first adhesive layer 20 and the OLED module layer 10.

The neutral plane N in the present application may be defined as a plane at which a compressive force and a tensile force are substantially the same when bending the OLED panel.

Typically, when an OLED panel is bent, a compressive force is applied to an inner side of a bent portion, and a tensile force is applied to an outer side of the bent portion. Thus, an inner device of the OLED panel may be damaged while being bent.

In a stack structure including a plurality of layers, a position of the neutral plane N may be adjusted by a thickness and an elastic modulus of each layer. According to exemplary embodiments, the neutral layer N may be positioned at the interface between the first adhesive layer 20 and the OLED module layer 10 so that an inner device of the OLED panel may be prevented from being damaged while being bent. Thus, damages of the OLED device and/or a touch sensor 30 may be avoided or reduced. Further, a bending property of the OLED panel may be improved while preventing damages of the inner device by bending.

In the present application, the phrase "the neutral layer N at the interface between the first adhesive layer 20 and the OLED module layer 10" may be used to indicate that a distance between the interface and the neutral plane N is within 3% of a total thickness of the OLED module layer and the first adhesive layer.

A thickness of the OLED module layer 10 may be in a range from about 80 μm to about 400 μm, and an elastic modulus of the OLED module layer 10 may be in a range from about 1,000 Mpa to about 8,000 MPa. The thickness and the elastic modulus of the OLED module layer 10 may be adjusted by controlling each thickness and elastic modulus of the layers included in the OLED module layer 10. Within the above thickness and elastic modulus ranges, the neutral plane N may be positioned at the interface between the first adhesive layer 20 and the OLED module layer 10.

In an implementation, the thickness and the elastic modulus of the OLED module layer 10 may be changed when the touch sensor layer 30 as described below may be added. For example, if the touch sensor layer 30 is included in the OLED module layer 10, the thickness of the OLED module layer 10 may be in a range from about 80 μm to about 260 μm, and the elastic modulus of the OLED module layer 10 may be in a range from about 1,000 MPa to about 8,000 MPa.

If the touch sensor layer 30 is included in a stack structure formed on a surface of the first adhesive layer 20 which is not in contact with the OLED module layer 10, the thickness of the OLED module layer 10 may be in a range from about 110 μm to about 400 μm, and the elastic modulus of the OLED module layer 10 may be in a range from about 1,000 MPa to about 8,000 MPa. Preferably, the thickness of the OLED module layer 10 may be in a range from about 150 μm to about 350 μm, and the elastic modulus of the OLED module layer 10 may be in a range from about 1,000 MPa to about 8,000 MPa.

In exemplary embodiments, the OLED module layer 10 may include an OLED device commonly known in the related art as a light emitting device. For example, the OLED module layer 10 may include an anode 12, an organic layer 11 including an organic light emitting layer 13, a cathode 14 and an encapsulation layer 15 which may be sequentially stacked.

The encapsulation layer 15 may be disposed on the cathode 14. If the organic light emitting layer 13 is in contact with a moisture or oxygen, the organic light emitting layer 13 may be oxidized to cause a reduction of life-span. Thus, the encapsulation layer 15 may serve as a barrier layer blocking a permeation of oxygen. Further, the encapsulation layer 15 may serve as an optical or electrical shielding layer.

The encapsulation layer 15 may include a structure commonly known in the related art. For example, a glass substrate, an organic layer or an organic-inorganic hybrid layer may be used. Preferably, the organic-inorganic hybrid layer may be used in an aspect of obtaining a flexible property.

In some embodiments, a planarization layer may be further formed on the encapsulation layer 15. The planarization layer may facilitate a uniform formation of a touch electrode thereon. Further, the planarization layer may include a refractive index matching layer (IML) for enhancing an image visibility. The refractive index matching layer may include an organic layer or an inorganic layer commonly known in the related art.

According to exemplary embodiments as described above, the neutral plane N may be formed at the interface of the first adhesive layer 20 and the OLED module layer 10. Thus, damages of OLED module layer 10 and the OLED device included therein may be prevented while bending the OLED panel.

In an implementation, the OLED layer 10 may further include a digitizer layer 16 and a shielding layer 17.

The digitizer layer 16 may be configured to detect an input signal through a pen and sense a touched position and a pressure applied to a surface thereof so that various display of, e.g., the position, a line-width depending on the pressure, a three-dimensional image and perspective, a color gradation, etc., may be implemented.

For example, the digitizer layer 16 may include an insulation layer, and a transparent electrode including patterns capable of detecting a pen touch and being coated on upper and lower surfaces of the insulation layer. The digitizer layer 16 may further include a pressure sensitive layer.

In an implementation, the OLED panel may further include the touch sensor layer 30 capable of detecting a touch from a user's hand.

In this case, the touch sensor layer 30 may selectively detect an input from the user's touch. The digitizer layer 16 may selectively detect the touch from the pen, and a transparent or semi-transparent insulation layer may be coated on the digitizer layer 16.

The shielding layer 17 may be disposed at a lower side (e.g., a side opposite to a visible side) of the OLED module layer 10 so that an electromagnetic wave introduced from the lower side of the OLED module layer 10 or diffused through the lower side of the OLED module layer 10 may be blocked to prevent a signal interference of devices. The shielding layer 17 may include a metal or an alloy.

The OLED module layer 10 and the stack structure may be combined with each other by the first adhesive layer 20. In an embodiment, a thickness of the first adhesive layer 20 may be in a range from about 20 μm to about 200 μm, preferably from about 20 μm to about 150 μm. An elastic modulus of the first adhesive layer 20 may be in a range from about 0.01 MPa to about 1 MPa, preferably from about 0.1 MPa to about 1 MPa. Within this ranges, the above-mentioned advantages may be effectively achieved.

Non-limiting examples of a material in the first adhesive layer 20 may include an acryl-based polymer, a silicone-based polymer, a urethane acryl-based polymer, etc.

The OLED module layer 10 may further include the touch sensor layer 30 for detecting the user's touch.

As illustrated in FIG. 1B, the touch sensor layer 30 may be included in the OLED module layer 10 formed on one surface of the first adhesive layer 20. In this case, a location of the touch sensor layer 30 may be properly adjusted in the OLED module layer 10. Preferably, the touch sensor layer 30 may be formed on a surface of the encapsulation layer 15 or the planarization layer.

In an embodiment, the touch sensor layer 30 may be included in the stack structure formed on the other surface of the first adhesive layer 20 which is not in contact with the OLED module layer 10 as illustrated in FIG. 1A. In this case, a location of the touch sensor layer 30 may be properly adjusted in the stack structure. Preferably, the touch sensor layer 30 may be formed on the other surface of the first adhesive layer 20 which is not in contact with the OLED module layer 10.

For example, a thickness of the touch sensor layer 30 included in the OLED module layer 10 may be in a range from about 10 μm to about 80 μm, and an elastic modulus of the touch sensor layer 30 may be in a range from about 500 MPa to about 6,000 MPa.

FIGS. 2 and 3 are a top plane view and a cross-sectional view, respectively, illustrating the touch sensor layer 30 in accordance with exemplary embodiments. For example, the touch sensor layer 30 may be a film-type touch sensor formed by a laminating process.

For example, FIG. 3 is a cross-sectional view taken along a line I-I' of FIG. 2 in a thickness direction of the touch sensor layer 30. For convenience of descriptions, an illustration of an insulating interlayer 130 and a passivation layer 150 is omitted in FIG. 2.

Referring to FIGS. 2 and 3, the touch sensor layer 30 may include a base layer 100, a first electrode layer 120, the insulating interlayer 130, a second electrode layer 140 and the passivation layer 150.

The base layer 100 may serve as a supporting layer for forming the first electrode layer 120. In the present application, the term "the base layer" may be used broadly to represent a lower member of the first electrode layer 120. For example, the base layer 100 may include a film-type member or a substrate, or may include a lower film or an object (e.g., a display panel of an image display device) on which the first electrode layer 120 is formed.

The base layer 100 may include a glass, a plastic or a flexible resin such as polyimide (PI), polycarbonate (PC), polyethylene terephthalate (PET), polymethyl methacrylate (PMMA), triacetyl cellulose (TAC), etc.

The first electrode layer 120 may be disposed on the base layer 100. In exemplary embodiments, the first electrode layer 120 may include a first sensing electrode 123 and a second sensing electrode 125.

The first sensing electrode 123 may include, e.g., polygonal unit patterns connected via a connecting portion 121 along a row direction. Accordingly, a first sensing line in the row direction may be defined, and a plurality of the first sensing lines may be arranged in a column direction.

The second sensing electrode 125 may include polygonal island patterns physically isolated from each other. The second sensing electrodes 125 may be electrically and physically separated from the first sensing electrodes 123. For example, the second sensing electrodes 125 may face each other in the column direction with respect to the connecting portion 121 of the first sensing electrode 123.

The first electrode layer 120 may include a metal, a metal nano wire, a transparent conductive oxide, etc.

The metal or the metal nano wire may include, e.g., gold (Au), silver (Ag), copper (Cu), aluminum (Al), platinum (Pt), palladium (Pd), chromium (Cr), tungsten (W), titanium (Ti), tantalum (Ta), iron (Fe), cobalt (Co), nickel (Ni), zinc (Zn), vanadium (V), niobium (Nb), molybdenum (Mo), etc., or an alloy thereof (e.g., silver-palladium-copper (APC)).

The transparent conductive oxide may include a conductive metal oxide such as indium tin oxide (ITO), indium zinc oxide (IZO), indium zinc tin oxide (IZTO), aluminum zinc oxide (AZO), gallium-doped zinc oxide (GZO), zinc tin oxide (ZTO), indium gallium oxide (IGO), etc. These may be used alone or in a combination thereof.

Electrode layers included in the touch sensor may be easily damaged during a bending operation. However, according to example embodiments, the neutral plane N may be formed at the interface between the first adhesive layer 20 and the OLED module layer 10 so that damages of the touch sensor layer 30 may be avoided while bending the OLED panel even when the touch sensor layer 30 includes the transparent conductive oxide.

In some embodiments, the first electrode layer 120 may include a multi-layered structure that may include a transparent conductive oxide layer and a metal layer (or a metal nanowire layer). In an embodiment, the first electrode layer 120 may have a stack structure of a first transparent conductive oxide layer-the metal layer (e.g., an APC alloy layer)-a second transparent conductive oxide layer.

The insulating interlayer 130 may partially cover the first electrode layer 120 on the base layer 100. The insulating interlayer 130 may be provided for an insulation between the first electrode layer 120 and the second electrode layer 140.

The insulating interlayer 130 may include an inorganic insulation material such as silicon oxide, or a transparent organic material such as an acryl-based resin. Preferably, the insulating interlayer 130 may be formed using an organic resin composition that may include a thermally curable or photo-curable material such as an epoxy compound, an acryl compound, a melanine compound, etc.

The insulating interlayer 130 may include a contact hole through which a top surface of the second sensing electrode 125 may be at least partially exposed.

The second electrode layer 140 may be disposed on the insulating interlayer 130 to fill the contact hole included in the insulating interlayer 130. In exemplary embodiments, the second electrode layer 140 may serve as a bridge electrode electrically connecting the second sensing electrodes 125 neighboring in the column direction. In this case, the touch sensor layer 130 may include a top-bridge type touch sensor. Alternatively, the touch sensor layer 130 may include a bottom-bridge type touch sensor.

According to example embodiments, the neutral plane N may be formed at the interface between the first adhesive layer 20 and the OLED module layer 10 so that damages of the bridge electrode that may have a relatively weak durability may be prevented while bending the OLED panel.

A second sensing line extending in the column direction may be defined by the second electrode layer 140 and the second sensing electrodes 125 while being insulated from the first sensing electrode 123. A plurality of the second sensing lines may be arranged along the row direction.

The first and second sensing lines may be connected to, e.g., wirings or traces of the touch sensor layer 30 at a peripheral portion thereof, and the traced or the traces may be connected to a driving circuit via pads. An information of X and Y coordinates at a touched area may be generated by the first and second sensing lines so that a positional signal may be transferred to the driving circuit.

The second electrode layer 140 may include a metal or a transparent conductive oxide. In an embodiment, the transparent conductive oxide may be used for improving transparency or transmittance.

The passivation layer 150 may be formed on the insulating interlayer 130 to cover the second electrode layer 140 so that the touch sensor layer 30 may be protected and insulated from an external environment. In exemplary embodiments, the passivation layer 150 may be formed using a photo-curable composition. The photo-curable composition may include a binder resin, a photo-curable compound, a photo initiator and a solvent. The passivation layer 150 may have improved photo-curable, developing and optical properties.

The OLED panel according to exemplary embodiments may include a stack structure formed on a surface of the first adhesive layer 20 which may not be in contact with the OLED module layer 10. The stack structure may include an optical layer 40, a second adhesive layer 50 and a window substrate 60.

A total thickness of the stack structure including the optical layer 40, the second adhesive layer 50 and the window substrate 60 may be in a range from about 60 μm to about 500 μm, and an elastic modulus of the stack structure may be in a range from about 200 MPa to about 6,000 MPa in consideration of advantageous effects of the present inventive concepts.

The optical layer 40 may include, e.g., a polarizing plate. Preferably, the polarizing plate having a thickness of about 10 μm to about 150 μm and an elastic modulus of about 1,000 MPa to about 4,000 MPa. The polarizing plate may include a polarizer and a protective film formed on at least one surface of the polarizer.

The polarizer commonly used in the related art may be used. For example, the polarizer may include a stretching type polarizer prepared by swelling, dyeing, cross-linking, stretching, washing and drying a polarizer forming film, a coating type polarizer prepared by curing a liquid crystal composition, or a combination thereof.

When the touch sensor layer 30 is included in the OLED module layer 10, the polarizing plate including the stretching type polarizer may be preferably used. When the touch sensor layer 30 is included in the stack structure formed on the surface of the first adhesive layer 20 which may not be in contact with OLED module layer 10, the polarizing plate including the coating type polarizer may be used.

The polarizer forming film may include, e.g., a dichroic material that may be dyed by iodine. For example, the polarizer forming film may include a polyvinyl alcohol film, a dehydrated polyvinyl alcohol film, a dehydrochlorinated polyvinyl alcohol film, a polyethylene terephthalate film, an ethylene-acetic acid vinyl copolymer film, an ethylene-vinyl alcohol copolymer film, a cellulose film or a partially saponificated film thereof. Among these films, the polyvinyl alcohol film may be preferably used from the aspects of obtaining uniformity of in-plane polarizing degree and iodine dyeing affinity.

The protective film may include a film having improved transparency, mechanical strength, moisture blocking property, isotropic property, etc. For example, a polyester-based film such as polyethylene terephthalate, polyethylene isophthalate, polybutylene terephthalate, etc.; a cellulose-based film such as diacetyl cellulose, triacetyl cellulose, etc.; a polycarbonate-based film; an acryl-based film such as polymethyl(meth)acrylate, polyethyl(meth)acrylate, etc.; a styrene-based film such as polystyrene, an acrylonitrile-styrene copolymer; a polyolein-based film such as cycloolefin, a cycloolefin copolymer, polynorbornene, polypropylene, polyethylene, an ethylene-propylene copolymer; a polyvinyl chloride-based film; a polyamide-based film such as nylon, an aromatic polyamide; an imide-based film; a sulfone-based film; a polyether ketone-based film; a polyphenylene sulfide-based film; a vinylalcohol-based film; a vinylidene chloride-based film; a vinyl butyral-based film; an allylate-based film; a polyoxy methylene-based film; an urethane-based film; an epoxy-based film; a silicone-based film, etc. Among these films, the cellulose-based film having a saponificated surface with an alkali may be preferably used in consideration of polarizing property and durability. The protective film may also have an optical compensation property such as a retardation property.

In an embodiment, the touch sensor layer 30 may be directly formed on the optical layer 40. For example, at least one member of the touch sensor layer 30 may be disposed on at least one surface of the protective film. The one member of the touch sensor layer 30 may be at least one of the sensing electrodes. In this case, the OLED panel may become thinner and have an enhanced visible property.

In an embodiment, the second adhesive layer 50 may have a thickness, an elastic modulus or a material substantially the same as or similar to those of the first adhesive layer 20. However, the thickness, the elastic modulus and the material of the second adhesive layer 50 may be adjusted independently from the first adhesive layer 20.

The window substrate 60 commonly known in the related art for protecting a touch screen panel may be used. For example, the window substrate 60 may include a tempered glass, a functional glass, a synthetic resin, and may have a thickness of about 25 µm to about 150 µm, and an elastic modulus of about 2,000 to about 7,000 MPa.

Image Display Device

According to exemplary embodiments, an image display device including the OLED panel is provided.

The image display device may have an improved bending ability and may be a flexible display device.

Hereinafter, preferred embodiments will be described to more concretely understand the present invention with reference to examples. However, it will be apparent to those skilled in the art that such embodiments are provided for illustrative purposes and various modifications and alterations may be possible without departing from the scope and spirit of the present invention, and such modifications and alterations are duly included in the present invention as defined by the appended claims.

Preparation of OLED Module Layer

Example 1

An anode, an organic layer including an organic light emitting layer, a cathode and an encapsulation layer were sequentially formed on a polyimide-based substrate (10 cm×10 cm, thickness: 30 µm), and then an acryl-based polymer was coated thereon to form a first adhesive layer.

Next, a touch sensor layer, a polarizing plate including a stretching type polarizer as an optical layer, an acryl-based adhesive layer and a polyimide-based window substrate were further stacked. In the touch sensor layer, an ITO electrode layer was formed on a triacetyl cellulose film. In the polarizing plate, triacetyl cellulose protective films were formed on both sides of a polyvinyl alcohol polarizer film and an optical compensation film was formed on one surface of the protective film.

A thickness of an OLED module layer was 180 µm, and an elastic modulus of the OLED module layer was 4,000 MPa. A thickness and an elastic modulus of the first adhesive layer were 50 µm and 0.1 MPa, respectively.

Example 2

Processes the same as those of Example 1 were performed except that a thickness and an elastic modulus of the OLED module layer were 250 µm and 1,600 MPa, respectively.

Example 3

Processes the same as those of Example 1 were performed except that a thickness and an elastic modulus of the first adhesive layer were 200 µm and 0.3 MPa, respectively.

Example 4

Processes the same as those of Example 1 were performed except that the touch sensor layer was formed between the encapsulation layer and the first adhesive layer.

A thickness and an elastic modulus of the OLED module layer were 150 µm and 4,500 MPa, respectively. A thickness and an elastic modulus of the first adhesive layer were 50 µm and 0.4 MPa, respectively.

Example 5

Processes the same as those of Example 4 were performed except that a thickness and an elastic modulus of the OLED module layer were 350 µm and 5,400 MPa, respectively.

Example 6

Processes the same as those of Example 4 were performed except that a thickness and an elastic modulus of the first adhesive layer were 200 µm and 0.3 MPa, respectively.

Comparative Example 1

Processes the same as those of Example 1 were performed except that a thickness and an elastic modulus of the OLED module layer were 560 µm and 1,500 MPa, respectively.

Comparative Example 2

Processes the same as those of Example 1 were performed except that a thickness and an elastic modulus of the first adhesive layer were 300 µm and 1 MPa, respectively.

Comparative Example 3

Processes the same as those of Example 4 were performed except that a thickness and an elastic modulus of the OLED module layer were 500 µm and 5,000 MPa, respectively.

Comparative Example 4

Processes the same as those of Example 4 were performed except that a thickness and an elastic modulus of the first adhesive layer were 300 µm and 1 MPa, respectively.

Comparative Example 5

Processes the same as those of Example 4 were performed except that a thickness and an elastic modulus of the OLED module layer were 250 µm and 500 MPa, respectively.

Comparative Example 6

Processes the same as those of Example 4 were performed except that a thickness and an elastic modulus of the OLED module layer were 250 μm and 10,000 MPa, respectively.

Experimental Example

Experiments as described below were performed on structures of Examples and Comparative Examples.

1. Measuring Modulus

A storage modulus of an adhesive layer was measured using a viscoelasticity measuring device (MCR-301, manufactured by Anton Paar). Specifically, an adhesive sample having a dimension of 30 mm (length)×30 mm (width) was prepared, and the sample was attached to a glass plate. The storage modulus was measured under a frequency 1.0 Hz and 2% deformation while being attached with a measuring tip.

A tensile modulus of the structure was measured by a universal testing machine (Autograph AG-I, manufactured by SHIMADZU) using a sample that was prepared to have a dimension of 100 mm (length)×40 mm (width). The tensile modulus was measured by a tensile test with a tension speed of 4 mm/min.

2. Measuring Bending Durability: Evaluation of Crack Occurrence

A bending durability was evaluated using a folding tester (DLDMLH-FS, manufactured by YUASA). Samples having a dimension of 100 mm×10 mm were prepared, and opposite sides of the samples were attached to the tester. Specifically, one sample was attached to the tester so that a bending tensional stress was applied to the OLED layer, and the other sample was attached to the tester so that a bending compressive stress was applied to the OLED layer. After attaching the sample, 200,000 cycles of the test were performed under a condition of 2R and 30 cycles/min.

TABLE 1

| | Property of OLED layer | | Property of First Adhesive Layer | | | |
|---|---|---|---|---|---|---|
| | Modulus (MPa) | Thickness (μm) | Modulus (MPa) | Thickness (μm) | ΔNP %*[1] (μm) | Crack Occurrence |
| Example 1 | 4000 | 180 | 0.4 | 50 | 0.4 | No Cracks |
| Example 2 | 1600 | 250 | 0.4 | 50 | 1.7 | No Cracks |
| Example 3 | 4000 | 180 | 0.3 | 200 | 2.8 | No Cracks |
| Example 4 | 4500 | 150 | 0.4 | 50 | 0.9 | No Cracks |
| Example 5 | 5400 | 350 | 0.4 | 50 | 2.4 | No Cracks |
| Example 6 | 4500 | 150 | 0.3 | 200 | 1.6 | No Cracks |
| Comparative Example 1 | 1500 | 560 | 0.4 | 50 | 16.7 | Cracks Occurred |
| Comparative Example 2 | 4000 | 180 | 1 | 300 | 16.9 | Cracks Occurred |
| Comparative Example 3 | 5000 | 500 | 0.4 | 50 | 25.8 | Cracks Occurred |
| Comparative Example 4 | 4500 | 150 | 1 | 300 | 20.6 | Cracks Occurred |
| Comparative Example 5 | 500 | 250 | 0.4 | 50 | 18.4 | Cracks Occurred |
| Comparative Example 6 | 10000 | 250 | 0.4 | 50 | 23.2 | Cracks Occurred |

*[1](A distance between the neutral plane and an interface of the OLED layer and the first adhesive layer/total thickness) × 100

Referring to Table 1, a distance between the neutral plane and the interface of the first adhesive layer and the OLED module layer was maintained below 3% relative to a total thickness of the first adhesive layer and the OLED module layer in Examples. Cracks were not caused during the bending durability test in Examples. However, cracks occurred in Comparative Examples having the distance (ΔNP %) greater than 3% during the bending durability test.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An organic light emitting diode (OLED) panel, comprising:
    an organic light emitting diode (OLED) module layer; and
    a first adhesive layer formed on a surface of the OLED module layer; and
    a neutral plane formed at an interface between the first adhesive layer and the OLED module layer;
    wherein a thickness of the OLED module layer is in a range from 80 μm to 400 μm;
    an elastic modulus of the OLED module layer is in a range from 1,000 MPa to 8,000 MPa;
    a thickness of the first adhesive layer is in a range from 20 μm to 200 μm; and
    an elastic modulus of the first adhesive layer is in a range from 0.01 MPa to 1 MPa.

2. The OLED panel of claim 1, wherein the OLED module layer includes an OLED device comprising an anode, an organic layer comprised of an organic light emitting layer, a cathode and an encapsulation layer which are sequentially stacked.

3. The OLED panel of claim 1, wherein the OLED module layer further includes a digitizer layer and a shielding layer.

4. The OLED panel of claim 1, wherein the OLED module layer includes a touch sensor layer.

5. The OLED panel of claim 4, wherein a thickness of the touch sensor layer is in a range from 10 μm to 80 μm; and
    an elastic modulus of the touch sensor layer is in a range from 500 MPa to 6,000 MPa.

6. The OLED panel of claim 4, wherein a thickness of the OLED module layer is in a range from 80 μm to 260 μm; and
    an elastic modulus of the OLED module layer is in a range from 1,000 MPa to 8,000 MPa.

7. The OLED panel of claim 4, wherein the OLED module layer further includes an encapsulation layer, and the touch sensor layer is formed on a surface of the encapsulation layer.

8. The OLED panel of claim 1, further comprising a stack structure formed on the other surface of the first adhesive layer which is not in contact with the OLED module layer, wherein the stack structure includes an optical layer, a second adhesive layer and a window substrate.

9. The OLED panel of claim 8, wherein a thickness of the stack structure is in a range from 60 μm to 500 μm; and
    an elastic modulus of the stack structure is in a range from 200 MPa to 6,000 MPa.

10. The OLED panel of claim 8, wherein the optical layer includes a stretching type polarizer or a coating type polarizer.

11. The OLED panel of claim 8, wherein the stack structure further includes a touch sensor layer.

12. The OLED panel of claim 11, wherein a thickness of the OLED module layer is in a range from 110 μm to 400 μm; and
    an elastic modulus of the OLED module layer is in a range from 1,000 MPa to 8,000 MPa.

13. The OLED panel of claim 11, wherein a thickness of the OLED module layer is in a range from 150 μm to 350 μm; and
    an elastic modulus of the OLED module layer is in a range from 1,000 MPa to 8,000 MPa.

14. The OLED panel of claim 11, wherein the touch sensor layer is formed on the other surface of the first adhesive layer which is not in contact with the OLED module layer.

15. The OLED panel of claim 11, wherein the touch sensor layer is directly formed on the optical layer.

16. An image display device comprising the OLED panel of claim 1.

* * * * *